United States Patent
Yedidia et al.

(10) Patent No.: US 7,103,825 B2
(45) Date of Patent: Sep. 5, 2006

(54) DECODING ERROR-CORRECTING CODES BASED ON FINITE GEOMETRIES

(75) Inventors: Jonathan S. Yedidia, Cambridge, MA (US); Marc P. C. Fossorier, Honolulu, HI (US); Ravi Palanki, Pasadena, CA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 560 days.

(21) Appl. No.: 10/643,618

(22) Filed: Aug. 19, 2003

(65) Prior Publication Data

US 2005/0044475 A1    Feb. 24, 2005

(51) Int. Cl.
*H03M 13/43* (2006.01)
*H03M 13/45* (2006.01)

(52) U.S. Cl. .................................. 714/760; 714/780

(58) Field of Classification Search ................ 714/760, 714/780
See application file for complete search history.

(56) References Cited

U.S. PATENT DOCUMENTS

| | | | | |
|---|---|---|---|---|
| 4,295,218 A | * | 10/1981 | Tanner | 714/762 |
| 4,404,674 A | * | 9/1983 | Rhodes | 714/793 |
| 4,819,231 A | * | 4/1989 | Yamada | 375/367 |
| 5,157,671 A | * | 10/1992 | Karplus | 714/752 |
| 6,944,805 B1 | * | 9/2005 | Seki | 714/707 |
| 2002/0116677 A1 | * | 8/2002 | Morelos-Zaragoza | 714/781 |
| 2002/0188906 A1 | * | 12/2002 | Kurtas et al. | 714/755 |

OTHER PUBLICATIONS

Rudolph, et al., "Algebraic Analog Decoding of Linear Binary Codes" IEEE Transactions on Information Theory, vol. IT-25, No. 4, Jul. 1979, pp. 430-440.*
Lucas, et al., "On Iterative Soft-Decision Decoding of Linear Binary Block Codes and Product Codes" IEEE Journal on Selected Areas in Communications, vol. 16, No. 2, Feb. 1998, pp. 276-296.*

(Continued)

*Primary Examiner*—Stephen M. Baker
(74) *Attorney, Agent, or Firm*—Dirk Brinkman; Andrew J. Curtin

(57) ABSTRACT

A method decodes a received word for a binary linear block code based on a finite geometry. First, a parity check matrix representation of the code is defined. The received word is stored in a channel register. An active register represents a current state of the decoder. Each element in the active register can take three states, representing the two possible states of the corresponding bit in the word, and a third state representing uncertainty. Votes from parity checks to elements of the active register are determined from parity checks in the matrix, and the current state of the active register. A recommendation and strength of recommendation for each element in the active register is determined from the votes. The elements in the active register are then updated by comparing the recommendation and strength of recommendation with two thresholds, and the state of the corresponding bit in the received word. When termination conditions are satisfied, the decoder outputs the state of the active register. If the decoder outputs a state of the active register that does not correspond to a codeword, a new representation for the code using a parity check matrix with substantially more rows is chosen, and the decoding cycle is restarted.

15 Claims, 3 Drawing Sheets

OTHER PUBLICATIONS

Lucas, et al., "Iterative Decoding of One-Step Majority Logic Decodable Codes Based on Belief Propagation" IEEE Transactions on Communications, vol. 48, No. 6, Jun. 2000, pp. 931-937.*

Yeo, et al., "High Throughput Low-Density Parity-Check Decoder Architectures" GLOBRCOM 2001, Nov. 2001, pp. 3019-3024.*

Richardson et al., "*The Capacity of Low-Density Parity-Check Codes Under Message-Passing Decoding,*" IEEE Trans. Information Theory, vol. 47, num. 2, pp. 599-619, Feb. 2001.

Blahut, "*Algebraic Codes for Data Transmission,*" Chapter 13, Cambridge University Press: Cambridge, 2003.

Lin et al., "*Error Control Coding: Fundamentals and Applications,*" Chapter 8, Prentice Hall: Englewood Cliffs, NJ, 1983.

* cited by examiner

DECODING ERROR-CORRECTING CODES BASED ON FINITE GEOMETRIES

FIELD OF THE INVENTION

The present invention relates generally to the field of error-correcting codes for data storage and data transmission, and more particularly to a decoding method for a class of error-correcting codes based on finite geometries.

BACKGROUND OF THE INVENTION

A fundamental problem in the field of data storage and communication is the development of practical decoding methods for error-correcting codes (ECC), see Blahut, "*Algebraic Codes for Data Transmission*," Cambridge University Press: Cambridge, 2003, and MacWilliams et al., "*The Theory of Error-Correcting Codes*," North-Holland: New York, N.Y., 1977.

BINARY LINEAR BLOCK ERROR-CORRECTING CODES

Any references to "codes" herein specifically mean binary linear block error-correcting codes. The basic idea behind these codes is to encode messages of k information bits using blocks of N bits, where N>k. The additional N−k bits are used to decode and correct corrupted messages. A block of N bits is also sometimes called a code-word, or simply a "word."

Corruption can be caused by failure in the storage media or noise in the transmission channel. Herein, it is assumed that the transmission channel can be modeled as a binary symmetric channel (BSC). In a binary symmetric channel, each bit can be independently flipped with some probability p.

A code C is defined by set of $2^k$ possible blocks of "code-words" having a block length N. k is sometimes called the "dimension" of the code. The "rate" R of a code is defined by R=k/N. Codes are normally much more effective when N and k are large. However, as the size of the parameters N and k increases, so does the difficulty of decoding corrupted messages.

The Hamming distance between two words is defined as the number of bits that differ in the two words. The distance d of a code is defined as the minimum Hamming distance between all pairs of code-words in the code. Codes with a larger value of d have a greater error-correcting capability. Codes with parameters N and k are referred to as (N, k) codes. If the distance d is also known, then they are referred to as (N, k, d) codes.

The class of binary linear block error-correcting codes includes a great variety of sub-classes of codes. Some of the most notable of these sub-classes are the low-density parity check (LDPC) codes; Bose, Chaudhuri, and Hocquenghen (BCH) codes; and codes based on finite geometries, such as Reed-Muller codes.

Reed-Muller Codes and Other Codes Based on Finite Geometries

One important class of error-correcting codes are the Reed-Muller codes, described by Reed et al., in "*A Class of Multiple-Error-Correcting Codes and the Decoding Scheme*," IRE Trans. Inform. Theory, vol. 4, pp. 38–49, September 1954, and Muller, "*Application of Boolean Algebra to Switching Circuit Design to Error Detection*," IRE Trans. Electron. Comput., vol 3, pp. 6–12, January 1954.

Other multiple-error correcting codes based on finite geometries, herein "finite geometry codes," were developed in the 1960's and 1970's, for an overview, see chapter 8 of Lin et al., "*Error Control Coding: Fundamentals and Applications*," Prentice Hall: Englewood Cliffs, N.J., 1983.

Finite geometry codes can be considered generalizations of Reed-Muller codes. The class of Reed-Muller codes is a sub-set of the class of Euclidean Geometry codes, which is a sub-set of a class of finite geometry codes.

It is possible to determine the parameters N, k, and d of finite geometry codes. The distances of such codes are somewhat worse than the distances of comparable Bose, Chaudhuri, and Hocquenghen (BCH) codes. See any of the textbooks on error-correcting codes previously mentioned for a description of BCH codes. On the other hand, a relative advantage of finite geometry codes is that their decoders are much simpler to implement than decoders for BCH codes.

Majority-Logic, Bounded-Distance, and Maximum-Likelihood Decoders

Up to now, Reed-Muller codes and other finite geometry codes have generally been decoded by a decoding method known as "majority-logic decoding." Majority-logic decoding is simple to implement and is extremely fast. For a description of majority-logic decoding, see chapter 13 of Blahut, "*Algebraic Codes for Data Transmission*," Cambridge University Press: Cambridge, 2003.

A majority-logic decoder is an example of a "bounded-distance decoder." The standard prior-art decoders for BCH codes, which are based on algebraic methods are also bounded-distance decoders.

A bounded-distance decoder decodes any received word to a nearest code-word, so long as the received word has a Hamming distance to the nearest code-word that is less than or equal to the bounded distance decoding radius t, where $t=\lfloor(d-1)/2\rfloor$. Here, the floor function $\lfloor x \rfloor$ indicates that the fractional part of x is subtracted. There can be at most one code-word within distance t or less of a word. Therefore, a bounded-distance decoder successfully decodes the received word to the transmitted code-word when the channel introduces t or fewer bit flips. Conversely, a bounded-distance decoder fails to decode when the received word has a distance from any code-word that is greater than the decoding radius t. If the channel introduces t or more bit flips, then the bounded-distance decoder fails to correctly decode the transmitted code-word.

The error-correcting performance of a bounded-distance decoder is normally much worse than the performance of an optimal, "maximum-likelihood" decoder. A maximum-likelihood decoder decodes any received word to the nearest code-word, whatever the Hamming distance from the received word to the nearest code-word. Unfortunately, the complexity of true maximum-likelihood decoders increases exponentially with the number of information bits k, making them impractical for codes with a reasonably large number of information bits.

It is desired to provide a practical decoder, which, while not quite optimal, performs much better than a bounded-distance decoder. Such a decoder should be capable of decoding correctly many, if not all, received words that are at a distance greater than t from any code-word.

It is an object of the invention to provide such a decoder for Reed-Muller and other codes based on finite geometries. Such a decoder should greatly-outperform the prior-art majority-logic decoding method.

Bit-Flipping Decoders

Bit-flipping decoders have been described for low-density parity check (LDPC) codes, see Gallager, "*Low Density Parity Check Codes*," MIT Press, 1963. As originally described by Gallager, those decoders represent the LDPC code by a parity check matrix. Such a decoder stores a current state of a received word to be decoded as a list of elements. Each element represents one bit of the received word. Each element can take on a value of 0 or 1. The list of elements is initialized to match the bits received after passing through a channel. At each iteration in the Gallager bit-flipping decoding method, every element in the list is tested to see whether it should be flipped. An element is flipped if a sufficient number of parity checks including that bit indicate that the element has the wrong value. The decoder is continually iterated, with the elements flips decided based on the latest updated values of the other elements. When the bit flipping procedure terminates, the values of the elements are taken as the bit values of the decoded word.

Similar tri-state bit flipping decoding methods were described in the context of decoding LDPC codes by Richardson et al., "*The Capacity of Low-Density Parity-Check Codes Under Message-Passing Decoding*," IEEE Trans. Information Theory, vol. 47, num. 2, pp. 599–619, February 2001, and by Mitzenmacher "*A Note on Low Density Parity Check Codes for Erasures and Errors*," SRC Technical Note 1998-017, December 1998. In a tri-state bit flipping decoder, the elements of the word being decoded can have values of 0, 1, or ?, where the "?" value indicates that the exact state of the element is uncertain.

It is desired to use a bit-flipping decoding method to decode a completely different class of codes, namely codes based on finite geometries, rather than LDPC codes.

Bit-flipping decoders for LDPC codes are not bounded-distance decoders. In contrast to codes based on finite geometries, it is normally impractical to even compute the distance d, for a given LDPC code. The fact that bit-flipping decoders are not bounded-distance decoders means that there is no guarantee that is possible to decode a received word even if it is only corrupted by t or fewer bit flips.

On the other hand, bit-flipping decoders have the advantage of potentially being able to decode-words that are corrupted by more than t bit flips. Bit-flipping decoders have, up to now, not been used for binary block codes other than LDPC codes. The primary reason is that up to now, bit-flipping decoders have been thought to be inappropriate for anything but LDPC codes.

Although Reed-Muller codes date from 1954, and bit-flipping decoders for LDPC codes date from the early 1960's, nobody has previously devised a way to use a bit-flipping decoder for Reed-Muller codes or other finite geometry codes. A possible explanation for this fact is that finite geometry codes must be represented in a non-obvious way for bit-flipping decoders to perform well.

Parity Check Matrix Representations of Codes

A binary block code is "linear" when the modulo 2 sum of any two code-words is also is a code-word. For example, the modulo 2 sum of 1110100 and 0111010 is 1001110. A parity check matrix can represent a linear code. In fact, many different parity check matrices can represent a linear code.

The parity check matrix representing an (N, k) code is defined by a matrix of 1's and 0's, with M rows and N columns. The N columns of the parity check matrix correspond to the N bits of the code.

Each row of the parity check matrix represents a parity check constraint. The bits involved in the constraint represented by a particular row correspond to the columns that have a 1 in that row. The parity check constraint forces the sum of the bits to be even, or equivalently 0 when summed modulo 2. For example, the parity check matrix $$\begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \end{bmatrix} \tag{1}$$

represents three constraints $$x_1 \oplus x_2 \oplus x_3 \oplus x_5 = 0 \tag{2}$$

$$x_2 \oplus x_3 \oplus x_4 \oplus x_6 = 0 \tag{3}$$

$$x_3 \oplus x_4 \oplus x_5 \oplus x_7 = 0, \tag{4}$$

where the element $x_i$ represents the value of the $i^{th}$ bit, which can be 0 or 1, and the symbol $\oplus$ represents the modulo 2 sum. This parity check matrix is one resent the well-known Hamming (N=7, k=4, d=3) code.

Some of the M different constraints represented by the parity check matrix are linearly dependent. In the parity check matrix given in equation (1), all the constraints are linearly independent. Another representation for the same code is the parity check matrix $$\begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \\ 1 & 0 & 0 & 1 & 1 & 1 & 0 \\ 0 & 1 & 0 & 0 & 1 & 1 & 1 \\ 1 & 0 & 1 & 0 & 0 & 1 & 1 \\ 1 & 1 & 0 & 1 & 0 & 0 & 1 \end{bmatrix}. \tag{5}$$

In this parity matrix, the last four rows are obtained by adding together combinations of the first three rows. This means that the last four rows are merely redundant constraints, and there are actually only three linearly independent rows. For example, the fourth row can be obtained by adding together the first two rows.

The number of linearly independent rows of a matrix is sometimes called the "rank" of the matrix. Therefore, this matrix has a rank of three. In general, the rank of an M by N parity check matrix representation of an (N, k) code is N−k.

Finite Geometries

Like other binary linear block codes, finite geometry codes can be represented by a parity check matrix. Of special interest are codes based on finite geometries known as "Euclidean geometries." Other codes are based on finite geometries known as "projective geometries." Although some details are different, the principles are the same. For more details see chapter 8 of Lin et al., "*Error Control Coding: Fundamentals and Applications*," Prentice Hall: Englewood Cliffs, N.J., 1983.

A finite geometry is a mathematical construct containing a finite number of objects that are analogous to the points, lines, planes, and hyper-planes of ordinary geometry. A finite geometry has a finite number of points called "0-flats." Certain sets of those points are called "lines," or "1-flats." Other sets of lines are called "planes," or "2-flats." Sets of planes are called "3-flats," and sets of 3-flats are called "4-flats," and so on. In general, the sets are called "µ-flats." These are well-known definitions in the finite geometry literature.

A Euclidean geometry EG(m, q) is characterized by two parameters, m and q. The "points" or "0-flats" in EG(m, q)

are vectors of m different q-ary elements. For example if q=2 and m=3, then the points of EG(m=3, q=2) are vectors consisting of three bits. Thus the eight points of EG(m=3, q=2) are 000, 001, 010, 011, 100, 101, 110, and 111.

The points of EG(m, q) can be labeled a number of different ways. In the example of EG(m=3, q=2), one natural labeling is 000=0, 001=1, 010=2, 011=3, 100=4, 101=5, 110=6, 111=7.

The q-ary elements are to be added or multiplied together according to the rules of a Galois field GF(q). See any textbook on error-correcting codes, including the ones previously referenced, for a description of Galois fields. When q=2, the rules of the Galois field are particularly simple. For GF(q=2), the addition rules are 0+0=0, 0+1=1+0=1, and 1+1=0, and are 0*0=0*1=1*0=0, and 1*1=1.

Lines in a finite Euclidean geometry are defined much as a line is defined in an ordinary geometry. A line in EG(m, q) is a set of points $\{a_0+\beta a_1\}$, where $a_0$ and $a_1$ are different points in EG(m, q), β runs over all the q-ary elements except 0, and addition and multiplication are defined using the arithmetic rules of GF(q). As an example, for the Euclidean geometry EG(m=3, q=2), it can be seen see that if $a_0$=010, and $a_1$=111, then the corresponding line is {010, 101}. Every pair of points forms a line in the Euclidean geometry EG(m=3, q=2).

Higher order μ-flats are defined in a similar way. For example, planes (2-flats) are defined as sets of points $\{a_0+\beta_1 a_1+\beta_2 a_2\}$, where $a_0$, $a_1$, and $a_2$ are linearly independent points in EG(m,q), and $\beta_1$ and $\beta_2$ run over all the non-zero q-ary elements. For example, if $a_0$=001, $a_1$=010, and $a_1$=100, then the corresponding plane is {001, 011, 101, 111}. Using the labeling of points that were selected previously for EG(m=3, q=2), this plane has points {1,3,5,7}.

When defining codes based on Euclidean geometries, the focus is on all the μ-flats that do not include the all-zero point. In the example using EG(m=3,q=2), the all-zero point is 000=0, and the planes that do not include the all-zero point are {1,2,4,7}, {1,2,5,6}, {1,3,4,6}, {1,3,5,7}, {2,3,4,5}, {2,3,6,7}, and {4,5,6,7}, where the labels are as defined for the points.

For a collection of n objects in total, and a set of those objects, one can define an "incidence vector" of the set with respect to the objects, which is a vector of n 0's and 1's, where a 1 in position i indicates that that the $i^{th}$ object is in the set. For example, if there are seven objects with labels 1 to 7, and one considers the set {2,5,6}, then the incidence vector for the set {1,2,5,6} with respect to the numbers 1 through 7 is 1100110.

In the example using EG(m=3, q=2), if the n objects are the 7 non-zero points, then the incidence vectors for the planes that do not contain the all-zeros point with respect to the non-zero points are 1101001, 1100110, 1011010, 1010101, 0111100, 0110011, and 0001111.

Codes Based on Finite Geometries

A Euclidean Geometry EG(m,s,v) code can be defined by a parity check matrix whose rows are the incidence vectors of all (v+1)-flats in EG(m,$2^s$) that do not contain the all-zeros point with respect to the non-zero point. For example, the EG(m=3,s=1, v=1) code can be defined by the parity check matrix $$\begin{bmatrix} 1 & 1 & 0 & 1 & 0 & 0 & 1 \\ 1 & 1 & 0 & 0 & 1 & 1 & 0 \\ 1 & 0 & 1 & 1 & 0 & 1 & 0 \\ 1 & 0 & 1 & 0 & 1 & 0 & 1 \\ 0 & 1 & 1 & 1 & 1 & 0 & 0 \\ 0 & 1 & 1 & 0 & 0 & 1 & 1 \\ 0 & 0 & 0 & 1 & 1 & 1 & 1 \end{bmatrix}.$$

It is important to note that the parity check matrix for a Euclidean geometry code defined in this way contains redundant rows. For example, although there are 7 rows in the parity check matrix for the EG(m=3, s=1, v=1) code above, only 3 of the rows are linearly independent, and the code is actually equivalent to the (n=7, k=4, d=3) Hamming code that was used previously as an example.

With an appropriate re-labeling of the points, a code based on a Euclidean Geometry can be defined in a cyclic form. For example, if the labeling 010=1, 100=2, 011=3, 001=4, 101=5, 110=6, 111=7 is used, then the parity check matrix is defined as $$\begin{bmatrix} 1 & 1 & 1 & 0 & 1 & 0 & 0 \\ 0 & 1 & 1 & 1 & 0 & 1 & 0 \\ 0 & 0 & 1 & 1 & 1 & 0 & 1 \\ 1 & 0 & 0 & 1 & 1 & 1 & 0 \\ 0 & 1 & 0 & 0 & 1 & 1 & 1 \\ 1 & 0 & 1 & 0 & 0 & 1 & 1 \\ 1 & 1 & 0 & 1 & 0 & 0 & 1 \end{bmatrix}$$

that has a circulant form making the cyclic symmetry more obvious.

As mentioned previously, Reed-Muller codes can be considered a special case of a code based on a Euclidean geometry. To be more precise, Reed-Muller codes are Euclidean geometry codes with s=1.

Codes based on other finite geometries are defined in a similar way. One uses the incidence vectors of high-order μ-flats with respect to the points of the finite geometry to define a parity check matrix for the code.

As described above, the most commonly used prior art decoders for finite geometry codes are majority-logic decoders, which are bounded-distance decoders.

It is desired to provide a practical decoding method which out-performs majority-logic decoders for finite geometry codes.

SUMMARY OF THE INVENTION

The present invention provides a method for decoding an (N, k) finite geometry code, where N is the block-length of the code, and k is the dimension of the code.

During initialization, the code is first represented by a parity check matrix with M rows and N columns, of rank N−k. Normally, the parity check matrix is highly redundant.

Then, the decoder can receive words. For the purposes of this invention, the words received by the decoder are N bit blocks of 0's and 1's.

The initialization procedure stores the received word in an N bit channel register $X_{channel}$.

The received word is also stored in an active register $x_{active}$. The register $x_{active}$ also stores N tri-state elements, where each element has a value of '0', '1', or '?', where a '?' indicates that the decoder is uncertain about the correct value.

Finally, the initialization procedure sets initial values of two thresholds $b_{flip}$ and $b_{uncertain}$.

Then, the decoder begins an iterated decoding cycle.

The first step of the decoding cycle checks for a termination condition. The termination condition is either that the current state of the register $x_{active}$ is a code-word, or that some other condition is satisfied, such as a predetermined number of decoding cycles have been performed.

If the termination condition is satisfied, then the decoder outputs the contents of the register $x_{active}$.

Otherwise, in the second step of the decoding cycle, the contents of register $x_{active}$ are used to determine updated "votes" that parity checks send to the elements.

In the third step of the decoding cycle, the votes that parity checks send to elements are used to determine a new state of the register $x_{active}$. The number of checks that tell each allayment to set its value to a '0' or '1' is compared with the thresholds $b_{flip}$ and $b_{uncertain}$ in order to determine the state of each element in the register $x_{active}$.

In the fourth step of the decoding cycle, the thresholds $b_{flip}$ and $b_{uncertain}$ are updated according to a pre-determined schedule.

Then, the decoding cycle returns to the check for a termination condition, and the cycle is repeated until the termination condition is satisfied.

If the decoder fails to output a code-word after the termination condition has been satisfied, then the process can be repeated any number of times, each time substantially increasing the number of parity checks in the parity check matrix.

DETAILED DESCRIPTION OF THE PREFERRED EMBODIMENT

Defining a Parity Check Matrix Representation for the Code

Figure 1:
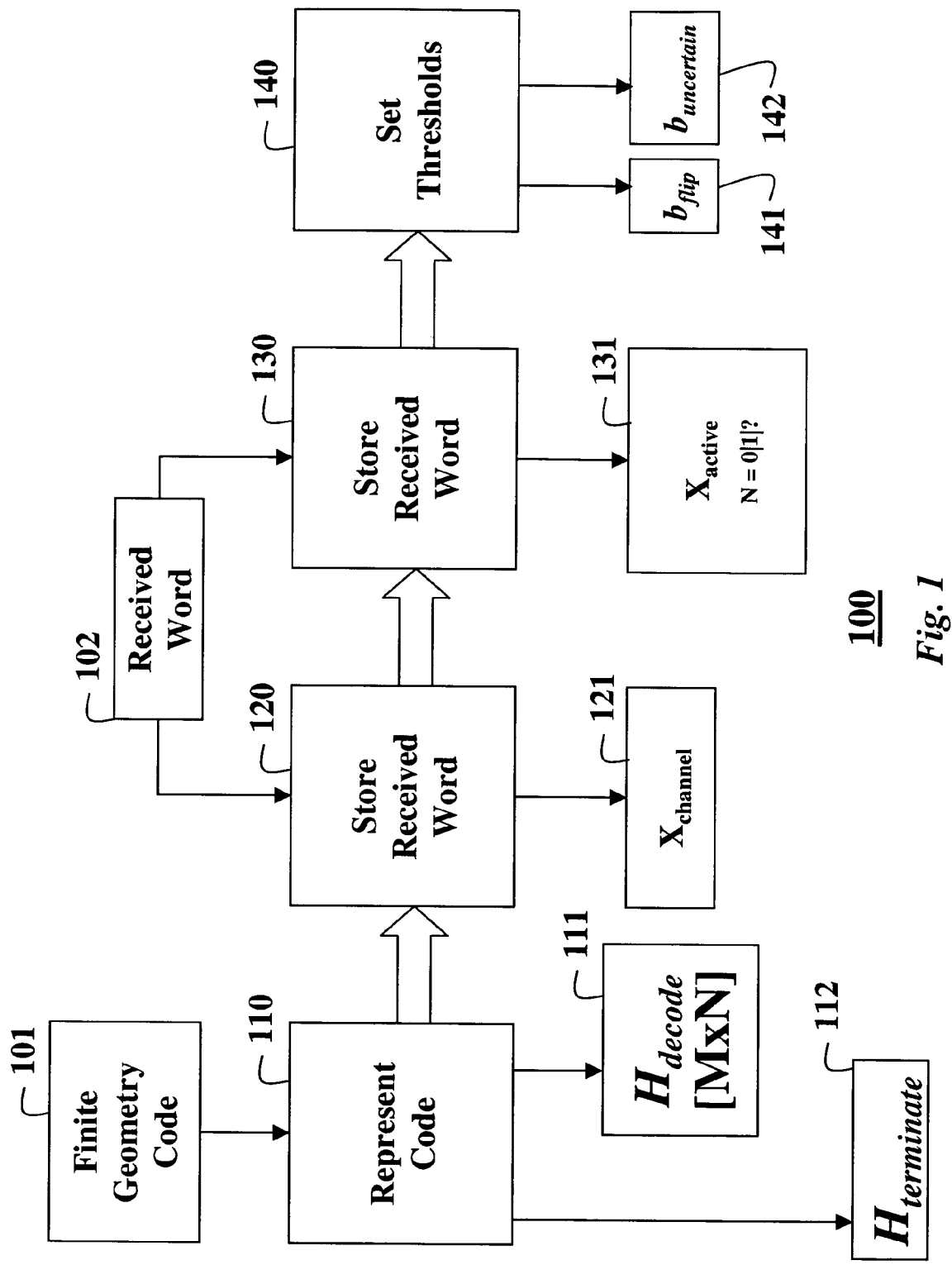
FIG. 1 is a flow diagram of an initialization procedure according to the invention.
Figure 2:
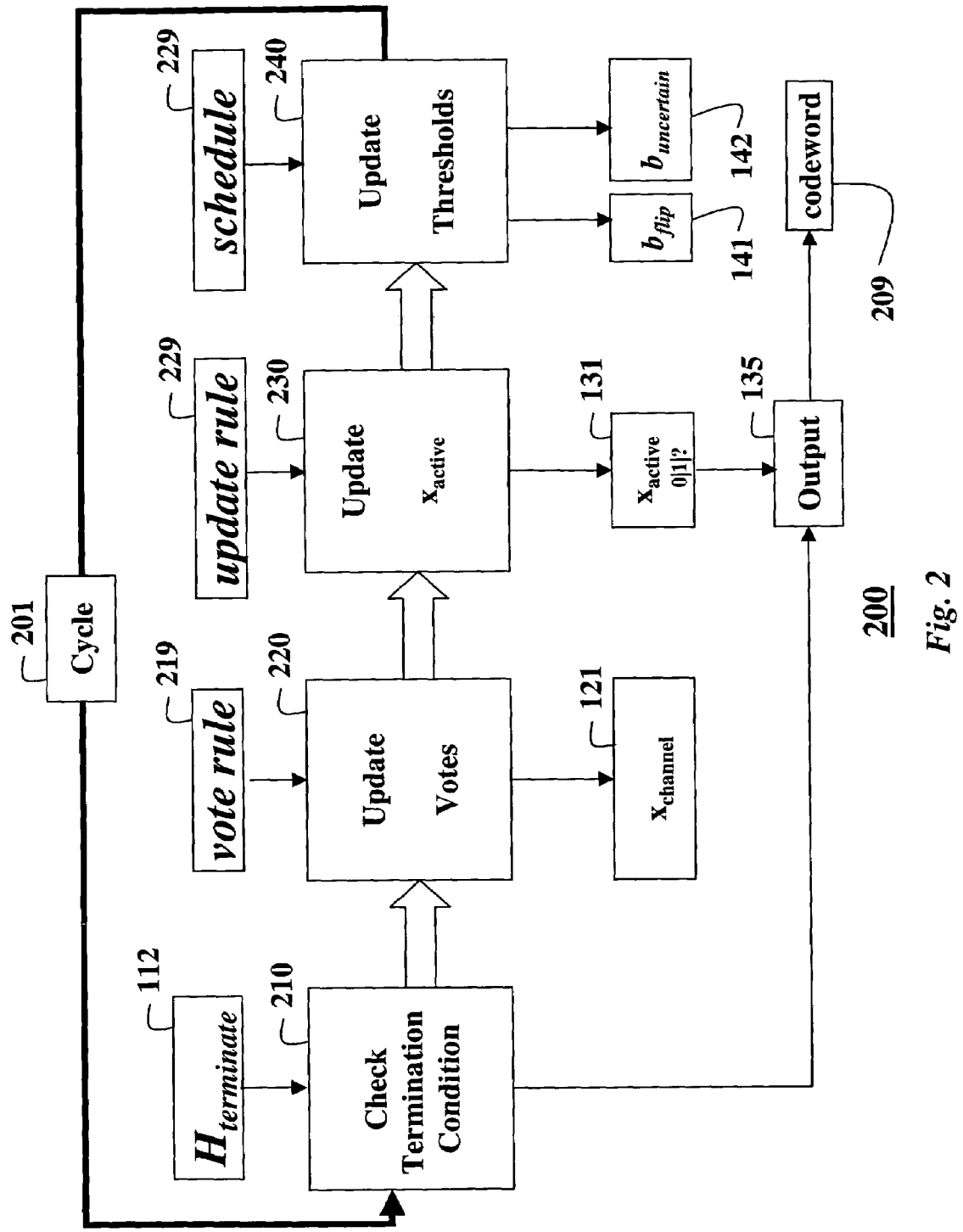
FIG. 2 is a flow diagram of the decoding procedure according to the invention.

FIGS. 1 and 2 shows steps of a method for decoding an error-correcting code based on a finite geometry according to our invention. The code has a block-length N and a dimension k. The code is based on a finite geometry with a given number of points N and a given number of μ-flats, as known in the art.

FIG. 1 shows a one-time initialization procedure 100, and FIG. 2 shows the step of an iterative decoding procedure 200.

Initialization

More precisely, we define the code 101 by a decoding parity check matrix ($H_{decode}$) 111 whose M rows are incidence vectors of a sub-set of μ-flats in the finite geometry with respect to the points in the finite geometry.

We define the M by N parity check matrix by selecting a sub-set of the μ-flats in the finite geometry, and using their incidence vectors with respect to the points of the finite geometry as the rows of our parity check matrix 111. We call this parity check matrix $H_{decode}$.

We can select any sub-set of the μ-flats, as long as a rank of the parity check matrix $H_{decode}$ is N−k. The performance of the decoder improves when we choose a larger number of μ-flats. However, a large number M of μ-flats also increases the complexity of the decoder. Normally, the number of μ-flats is substantially larger than N−k, in order for the decoder to perform well.

In the ordinary parity check matrix representation for an (N,k) LDPC code, the number of parity checks, i.e., rows in the matrix, is either exactly N−k or very close to N−k. Bit-flipping decoders work reasonably well with LDPC codes, even using a relatively small number of parity checks, because each parity check sends relatively reliable information. Parity checks in LDPC codes only involve a small number of bits, which makes them relatively reliable, because it is unlikely that very many of the bits are in error.

Parity checks for a finite geometry code tend to be somewhat less reliable than those for LDPC codes, because each parity check for a finite geometry code tends to involve a somewhat larger number of bits than the parity checks in a comparable LDPC code. For this reason, it is very important that the number of parity checks used for finite geometry codes is substantially larger than N−k.

Fortunately, it is possible to select more than N−k parity checks for a finite geometry code, because there are normally many more than N−k of the appropriate μ-flats. In fact, there are often so many μ-flats, that when we select only a small fraction of the possible μ-flats, we still have a sufficient number.

In the finite geometry, each μ-flat contains the same number of points J, so each of the M rows of our parity check matrix has J ones, and N−J zeros. For a EG(m, q) Euclidean geometry, each μ-flat contains $J=q^m$ points.

We prefer to use μ-flats that are obtainable as cyclic shifts of each other. In that case, each column of the parity check matrix has the same number of ones.

For convenience, we also prefer to use a termination parity check matrix ($H_{terminate}$) 112, representing the same code 101, that has a smaller number of rows than $H_{decode}$. This second parity check matrix $H_{terminate}$, is used to check 210, in part, whether a termination condition is satisfied during the decoding cycles. The matrix $H_{terminate}$ has rank N−k, and only N−k rows.

Given the parity check matrices 111–112 representation of the code, and a received word 102, we store 120 the received word in a N-bit register $X_{channel}$ 121. We store the received word because at every iteration of the decoding cycle, the decoder compares votes of parity checks with channel evidence to make decisions.

We also store 130 the received word in a second N-element register $X_{active}$ 131 The register $x_{active}$ represents a state of the decoder for a value of each of the N bits of the code. Each element of the register $x_{active}$ can take on one of three values: '0', '1', or '?'. The '?' value indicates that the decoder is uncertain about the correct value of the corresponding element.

We set 140 two thresholds, $b_{flip}$ and $b_{uncertain}$ to positive integers. The thresholds are set so that $b_{flip} \geq b_{uncertain}$. Both thresholds are normally set to large integers of the order of the number of ones in a column of the parity check matrix 111.

The threshold $b_{flip}$ is normally set to be substantially larger than the threshold $b_{uncertain}$. For example, if the number of ones in a column of the parity check matrix 111 is K, than a good initial setting for the thresholds would be $b_{flip} \approx K$, and $b_{uncertain} \approx 9K/10$. There needs to be a gap between the two thresholds for the uncertain state of the elements to be used in the updating rule 240.

Decoding

The decoder 200 repeatedly cycles 201 through the steps until the termination condition is satisfied in the first step 210 of the decoding cycle. When the termination condition is satisfied, the decoder outputs 135 the contents of the register $x_{active}$ 131 as an estimate of the transmitted code-word 209.

Termination Conditions

The first step 210 of the decoding cycle is to check whether any termination condition is satisfied. A number of termination conditions can be used. One termination condition checks whether the state of the register $x_{active}$ corresponds to a code-word. For this to be true, none of the elements of $x_{active}$ have the value '?', and all the parity checks in the parity check matrix $H_{termination}$ 112 are satisfied. If the register $x_{active}$ contains the code-word, then the decoder terminates, and outputs 135 the code-word 209.

Another termination condition ensures that the decoder does not cycle through the decoding cycle forever. There are various possible conditions that would ensure that does not happen. The simplest possibility is a termination condition that checks whether a fixed maximum number of cycles have already been performed, or a fixed amount of time has elapsed. If the termination condition is reached and register $x_{active}$ does not correspond to a code-word, then the decoder has clearly failed to decode the received word perfectly. The decoder still outputs the contents of the register $x_{active}$ because many of the individual bits are likely to be correct. In addition, the entire process can be restarted with a larger parity check matrix as shown in FIG. 3.

Figure 3:
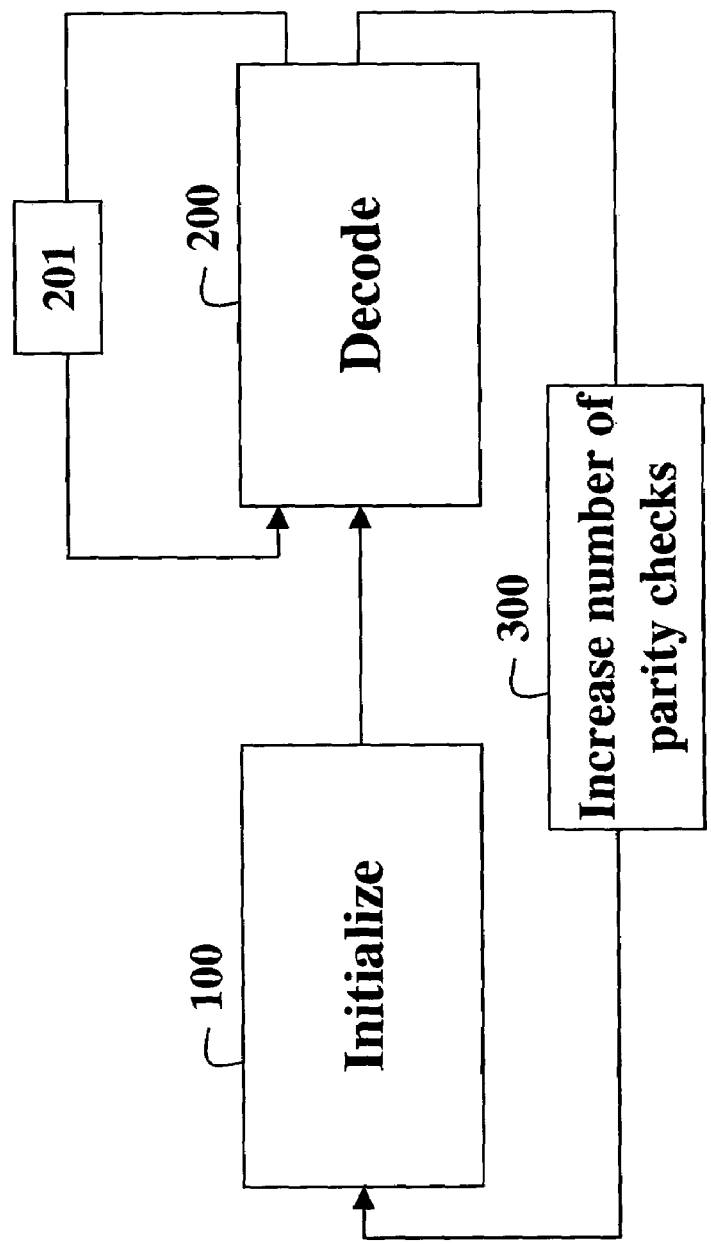
FIG. 3 is a flow diagram of the decoding procedure with restart.

Thus, as shown in FIG. 3, if the decoder fails to output a code-word after the termination condition has been satisfied, then the process can be repeated a number of times, each time substantially increasing 300 the number of parity checks in the parity check matrix 111. Such a procedure enables most of the received words to be decoded using a relatively small number of computations, while still decoding the more difficult received words by using more parity checks when necessary.

The limits on using such a re-starting procedure are the number of µ-flats available for representing the code, and the time available for decoding.

Parity Check Votes

Assuming that the termination condition is not satisfied, the next step 220 of the decoding cycle evaluates 220 "votes" that parity checks in the matrix 111 send to the elements according to a vote rule 219 described below.

There are M parity checks. Each parity check a corresponds to a row of the parity check matrix $H_{decode}$ 111. For each parity check, the parity check sends votes to J elements. Each such element corresponds to a column of the parity check matrix that has the value 1 in the row a.

We say that a element "belongs" to a parity check when the parity check sends the element a vote. In total, there are MJ votes.

Each vote from a parity check a to an element i can take on three possible values: a '0', a '1', or an abstain. A '0' vote means that the parity check votes that the element takes on the value 0, a '1' vote means that the parity check votes that the element takes on the value 1, and a '?' vote is an abstention. That is, the parity check does not vote on the value of the element because the value is uncertain.

The parity check a sends an element i a vote based on the following rule 219.

If any of the J−1 elements that belong to a, other than i currently are in the '?' state in the register $x_{active}$, then the vote is abstain. Otherwise, if an odd number of the other J−1 elements are in the state '1', then the vote is a '1'. If an even number of the other J−1 elements are in the state '0', then the vote is a '0'.

The point of the rule 219 is that each parity check tries to make certain that an even number of associated elements are in the state '1'.

Updating Elements

After all MJ votes from parity checks to elements have been computed, the values of the N elements, stored in $x_{active}$ 131 are updated 230.

Before the elements are updated, we determine a "recommendation" and a "strength" for that recommendation for each element from the parity check votes. For each element i, the number of parity checks voting that the element is a '1' is compared to the number of parity checks voting that the element is a '0'.

The value ('1' or '0') that receives the most votes is considered to be the recommendation of the parity checks, and the magnitude of the difference between the votes is considered to be the strength of the recommendation.

For example, if eight parity checks vote that the third element has the value '0', and six parity checks voted that the element has the value '1', then the parity checks' recommendation for the third element is '0', with the strength 8−6=2. If there is a tie in the votes for the element, then that element has no recommendation from the parity checks.

We update values of each of the elements in $x_{active}$ according to the following update rule 229.

For each of the N elements, if the recommendation of the parity checks agrees with the value of the corresponding element in $x_{channel}$ 121, or if there is no recommendation, then the updated value of $x_{active}$ 131 is equal the value of the corresponding element in $x_{channel}$ 121. If the recommendation of the parity checks for a element disagrees with the value of the corresponding element in $x_{channel}$, then there are three possibilities. If the strength of the recommendation is less than the threshold $b_{uncertain}$, then the value of the element is set to equal the value of the corresponding element in $x_{channel}$. If the strength of the recommendation is greater than or equal to $b_{uncertain}$ but less than the threshold $b_{flip}$, then the value of the element is set to '?'. Finally, if the strength of the recommendation is greater than or equal to the threshold $b_{flip}$, then the value of the element is set to equal the recommendation of the parity checks.

The basic idea behind our rules is that the decoder matches each element to the corresponding bit in the received word, unless a sufficient number of parity checks vote to 'flip' the value. If an intermediate number of parity checks vote to flip, the element is set to the uncertain value '?'. As mentioned previously, there is a gap between the values of threshold $b_{flip}$ and threshold $b_{uncertain}$ for the uncertain value for the elements to be used. The larger the gap between the thresholds, the more often the uncertain value is used.

Updating the Thresholds

In the next step of the decoding cycle, the thresholds $b_{flip}$ and $b_{uncertain}$ are updated 240 according to a pre-determined schedule 239. Empirically, a best schedule initializes the two thresholds 141–142 to large positive values with a fixed difference between the values, and then decreases both thresholds by the same amount at each iteration of the decoding cycle, until the thresholds reach the value of zero, where they remain.

The idea behind such a decoding schedule is that initially, the decoder considers, most strongly, the evidence of the received word stored in $x_{channel}$ 121. As the thresholds decrease, the votes of the parity checks become increasingly influential.

The initial effects of the parity checks merely sets elements to uncertain values. Eventually, using this kind of schedule, the parity checks become more aggressive, and flip the values of elements away from the value given by the received word. Thus, the decoder can be characterized as being "conservative," in that it tries to accept and follow the values of the bits given in the received word, and only makes large changes when necessary.

After the thresholds are updated 240, another decoding cycle 201 begins. The decoder finally terminates when the termination condition is satisfied.

Effect of the Invention

The invention is able to decode received words that have been corrupted by more than t bit flips, where t is a bounded distance decoding radius. Experiments show that our decoder is in fact able to decode many such received words.

For example, we implemented our decoder for (N=255, k=127, d=21), EG(m=4, s=2, v=1) code. The associated Euclidean geometry EG(m=4, q=4) has 255 non-zero points and 5355 2-flats that do not contain the zero point, each including 16 points. We construct a parity check matrix representing the code with 5355 rows and 255 columns.

The bounded distance decoding radius for this code is t=10, which means that the prior art majority-logic decoders will fail to decode if the received word has more than 10 bits flips. Our decoder very often succeeded in successfully decoding such received words. For example, if we corrupt a transmitted word with 16 bit flips, then we only have a word decoding error rate of around 0.00001. If we corrupt the transmitted word with 18 bit flips, then the word decoding error rate is only around 0.00015. If we corrupt the transmitted word with 20 bit flips, the word decoding error rate is only around 0.0008. If we corrupt the transmitted word with 22 bit flips, the word decoding error rate is around 0.004.

These performance results indicate that our decoder outperforms comparable BCH codes that use bounded-distance decoders. For example, the parameters of a comparable BCH code are (N=255, k=123, d=39). This code has a slightly worse error rate than our code, and the bounded distance decoding radius is only 19.

If a prior-art algebraic bounded distance decoder for the BCH code is used, then the decoder's failure rate is 100% when a received word has more than 19 bit flips. Surprisingly, the failure rate of our decoder is only 0.004% when a received word has as many as 22 bit flips. These are surprising results.

These unexpected results are significant, because for codes of this block-length and rate, algebraic bounded-distance decoders for BCH codes had, up to now, given the best reported performance for decoding on the binary symmetric channel.

We obtain similar experimental results for other codes based on finite geometries, including the (N=511, k=256, d=31) Reed-Muller code.

Although the invention has been described by way of examples of preferred embodiments, it is to be understood that various other adaptations and modifications may be made within the spirit and scope of the invention. Therefore, it is the object of the appended claims to cover all such variations and modifications as come within the true spirit and scope of the invention.

We claim:

1. A method for decoding a received word for a finite geometry code, comprising:
    a one-time initialization procedure; comprising:
        defining a parity check matrix for the finite geometry code;
        representing each bit in the received word by an element, each element having either a zero, one or uncertain value; and
    an iterative decoding procedure, comprising:
        terminating when a termination condition is true, and otherwise:
        determining a set of votes for each element depending on the parity check matrix and current values of the elements;
        updating the elements based on the set of votes for each element and the received word.

2. The method of claim 1, in which the parity check matrix representing an (N,k) finite geometry code has M rows and N columns and rank N–k, and the M rows are incidence vectors of a set of selected μ-flats in the finite geometry with respect to N points of the finite geometry, each row containing J ones and N–J zeros.

3. The method of claim 1, in which the μ-flats are cyclic shifts of each other.

4. The method of claim 1, in which each of the elements express a state of the decoder corresponding to a bit of the received word, and the termination condition is satisfied when the state of the decoder is a code-word.

5. The method of claim 1, in which the initialization procedure and the decoding procedure are restarted with a substantially larger parity check matrix if the termination condition is satisfied and the state of the decoder does not correspond to a code-word.

6. The method of claim 1, in which each row of the parity check matrix corresponds to a parity check, and each parity check sends votes to J elements, where the elements that a parity check sends a vote to correspond to the columns of the parity check matrix that have the value 1 in a row corresponding to the parity check.

7. The method of claim 6, in which the vote for a particular parity check to a particular element is determined by states of the J–1 other elements associated with the parity check.

8. The method of claim 6, in which the vote from a particular parity check to a particular element is an abstention if any of the J–1 other elements associated with the parity check has the uncertain value, and is one when the number of other elements associated with the parity check having a value of one is odd, and is zero otherwise.

9. The method of claim 6, further comprising:
    determining a recommendation and strength of recommendation for each element from the associated parity checks that send a vote to it.

10. The method of claim 9, in which the recommendation is zero when a majority of the votes are zero, the recommendation is one when the majority of the votes are one, and there is no recommendation when the zero and one votes are equal.

11. The method of claim 10, in which the strength of the recommendation is a magnitude of a difference between the number of zero votes and the number of one votes.

12. The method of claim 11, in which the votes determine a next updated state of a particular element by means of a comparison of the strength of the recommendation of the parity checks with a threshold $b_{flip}$ and a threshold $b_{uncertain}$.

13. The method of claim 12, in which the next updated state of a particular element is equal to a value in the received word if the recommendation of the parity checks agrees with the value in the received word.

14. The method of claim 12, in which the next updated state of a particular element is equal to a value in the received word if the recommendation of the parity checks is not equal to the value in the received word, and the strength of the recommendation is less than the threshold $b_{uncertain}$, and the next updated state of the particular element is a state representing uncertainty if the recommendation of the parity checks is not equal to the value in the received word, and the strength of the recommendation is greater than or equal to the threshold $b_{uncertain}$, and less than the threshold $b_{flip}$, and the next updated state of the particular element agree with the recommendation of the parity checks if the strength of the recommendation is greater than the threshold $b_{flip}$.

15. The method of claim 12 further comprising:

updating the values of the thresholds at an end of each decoding cycle, according to a pre-determined schedule.

* * * * *